United States Patent [19]

Karam et al.

[11] Patent Number: 5,105,445
[45] Date of Patent: Apr. 14, 1992

[54] PREDISTORTION ARRANGEMENT FOR A DIGITAL TRANSMISSION SYSTEM

[75] Inventors: Georges Karam, Paris; Hikmet Sari, Creteil, both of France

[73] Assignee: U.S. Philips Corporation, New York, N.Y.

[21] Appl. No.: 595,120

[22] Filed: Oct. 9, 1990

[30] Foreign Application Priority Data

Oct. 6, 1989 [FR] France .................. 89 13093

[51] Int. Cl.$^5$ ........................... H04L 25/03
[52] U.S. Cl. ..................... 375/60; 330/149; 332/107
[58] Field of Search ............ 375/39, 59, 60; 330/149; 332/107, 123, 124, 160, 176; 455/108, 126

[56] References Cited

U.S. PATENT DOCUMENTS

| | | | |
|---|---|---|---|
| 4,291,277 | 9/1981 | Davis et al. | 330/149 |
| 4,462,001 | 7/1984 | Girard | 330/149 |
| 4,554,514 | 11/1985 | Whartenby et al. | 330/149 |
| 4,675,618 | 6/1987 | Cross | 375/60 |
| 4,700,151 | 10/1987 | Nagata | 332/123 |

*Primary Examiner*—Stephen Chin
*Attorney, Agent, or Firm*—David R. Treacy

[57] ABSTRACT

Predistortion arrangement (9) for a digital transmission system transmits complex input data of a constellation by means of a modulator (14) and a power amplifier (15) which distorts the data. The arrangement comprising a predistortion circuit (11) which predistorts the input data in opposite sense before they pass through the amplifier and a transmit filter (10) which applies oversampled filtered data encoded with 2N bits to the predistortion circuit (11) at the rate k/T. The predistortion circuit (11) first determines approximate values of the predistorted data on the basis of a portion of 2M bits of the field of 2N bits (M<N), which data are thereafter revised with the aid of the remaining portion of said field. The predistortion circuit includes for each channel a memory (112) addressed by the field of M bits which produces the approximate values of the predistorted data and an interpolation circuit (111) which derives therefrom the revised predistorted data.

16 Claims, 6 Drawing Sheets

PREDISTORTION ARRANGEMENT FOR A DIGITAL TRANSMISSION SYSTEM

RELATED APPLICATIONS

This application is related in subject matter to the following commonly owned U.S. patent applications: Ser. No. 407,380, filed Sep. 14, 1990; Ser. No. 462,662 filed Jan. 9, 1990; Ser. No. 494,088, filed Mar. 14, 1990; and an application filed concurrently herewith, inventors Georges Karam and Said Moridi, entitled "Predistortion Arrangement For A Digital Transmission System".

BACKGROUND OF THE INVENTION

1. Field of the Invention

The invention relates to a predistortion arrangement for a digital transmission system which transmits complex input data at the rate of a symbol clock H having a period T, with the aid of a modulator and a power amplifier which distorts the date, the arrangement comprising a predistortion circuit predistorting in opposite sense the input data before they pass through the amplifier in order to transmit the expected input data. The invention finds its applications in digital transmission systems such as data transmission modems, microwave links, space communications systems.

2. Description of the Related Art

For an efficient use of the available spectrum, the current digital transmission systems, more specifically, the microwave radio relay links and systems for data transmission over the telephone channel, use multilevel phase and amplitude modulation methods. These modulation methods are very sensitive to all sorts of distortion and, more specifically, to non-linear distortions from amplifiers, mixers and other non-linear circuits in the transmission chain. A particularly critical point with respect to microwave radio relay links and satellite transmission is the non-linearity of the send power amplifier or of the power amplifier on board in the case of satellite transmission. These amplifiers are known for their non-linear characteristics. If they are used in their linear zones their power is not utilized to full extent. If they are allowed to operate close to their saturation power levels, they will distort the signal in an unacceptable manner. In practice, with a given power amplifier, the level of the transmitted signal is fixed in order to realize a compromise between the signal-to-noise ratio and the non-linear distortion which the signal has undergone. Thus, the optimum operating point of the amplifier is that at which the joint effects of the additive noise of the channel and the non-linear distortion of the amplifier are minimized. For multilevel modulation methods (64-QAM and 256-QAM, for example) this point is remote from the saturation power of the amplifier, which means that the amplifier is not used in an efficient way. In order to augment its efficiency, predistortion techniques (fixed or adaptive) are currently used with which it is possible to reduce the effect the non-linearity of the power amplifier has on the transmitted signal.

A predistortion technique currently used consists of inserting into the intermediate-frequency stage of the transmitter a non-linear circuit approaching the inverse function of the power amplifier whose non-linearities are intended to be compensated. If the exact inverse of the function of the amplifier could be synthesized, this technique would make it possible to have the perfect output signal (without any non-linear distortion). However, this cannot be realized because a circuit of infinite complexity would be necessary for the exact inverse. In practice, it is sufficient to make an approximation and more often than not the Taylor series representing the non-linear function of the amplifier is restricted to the third order and a predistortion circuit is synthesized, also of the third order, so that the two cascaded circuits no longer have a third order distortion. Terms of higher order (5th and 7th order) appear at the output but have a low amplitude compared to the initial third order distortion. As a result, there is a certain improvement of the system performance. A disadvantage of these predistortion circuits in the intermediate frequency stage resides in the fact that they are analog circuits. They are hard to render adaptive and require intermittent interventions to readjust them and compensate for the time and temperature variations of the amplifier response. This predistortion technique is furthermore to be excluded if one wishes to have an automatic send power control.

Another more recent predistortion technique consists of modifying the alphabet of the data to be transmitted. This technique termed "data predistortion" or "baseband predistortion" is known from U.S. Pat. No. 4,291,277 as well as the article by A. A. M. SALEH and J. SALZ entitled "Adaptive Linearization of Power Amplifiers in Digital Radio Systems", Bell System Technical Journal, Vol. 62, April 1983, pp. 1019–1033.

Figure 1:
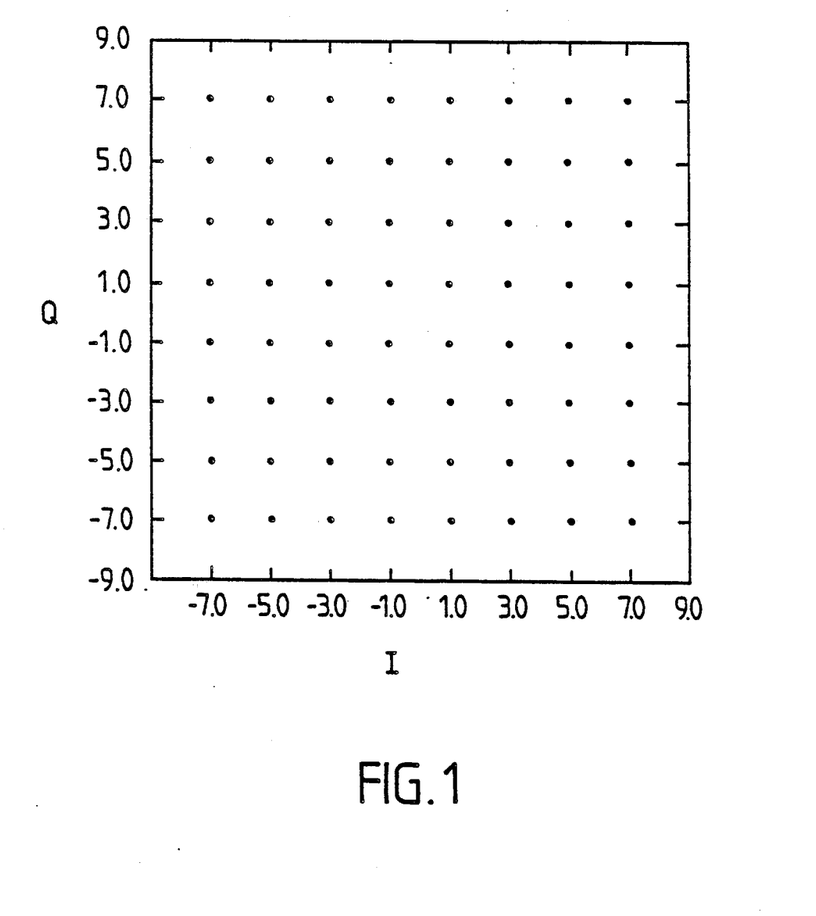
FIG. 1: the constellation of a 64-QAM modulation.

In the article by A. A. M. SALEH and J. SALZ, FIG. 1 is a diagram of an adaptive predistortion circuit which produces a distorted constellation at the input of the modulator on the basis of the original square constellation, for example that of an amplitude modulation of two quadrature carriers (QAM). The amplifier affects the constellation by producing a net compression and a net rotation of the points having a large amplitude. In order to compensate for this effect the original constellation is distorted so that it resumes its original square form after passing through the power amplifier. Thus, when the predistortion circuit is optimized, it forms the reverse of the power amplifier (apart from gain and phase) and permits perfect compensation for the non-linearities of the amplifier. In order to make this circuit adaptive, the signal is taken off at the output of the amplifier, demodulated, then sampled at the transmit rate of the symbols $1/T$ and these samples are compared to the corresponding points of the QAM constellation used. These comparisons make it possible to obtain a control signal allowing of optimizing the predistortion circuit with the aid of a conventional algorithm. However, the diagram used in this FIG. 1 is very simplistic because it does not have any filtering before the modulator, or before the power amplifier. Thus it does not correspond to the solution generally used. In effect, in present systems one always uses a spectral shaping filter of the Nyquist type which makes it possible to limit the bandwidth of the signal while guaranteeing zero intersymbol interference at the decision instants. This filtering is generally equally divided between the transmitter and the receiver in order to maximize the signal-to-noise ratio at the decision instants. In systems of this type, the effect of the non-linearity of the amplifier is twofold: the constellation is not only deformed but intersymbol interference appears which associates a cloud of points to each point of the constellation. But the predistortion technique described hereinbefore does not make it possible to compensate this second effect.

SUMMARY OF THE INVENTION

The problem posed is thus to realize a predistortion circuit which makes it possible not only to correct the constellation but also considerably reduce the dispersing of each point of the original constellation into a cloud of points and also to ensure at the receive end a better protection against adjacent channel interference.

This object has to be achieved by maximizing the reduction of the complexity and the quantity of the required material.

The solution to this problem consists of the fact that the system comprises a transmit filter which applies filtered, oversampled data encoded with 2N bits to the predistortion circuit at the rate k/T (where k is an integer greater than 1) in response to the input data, which circuit includes means for first determining approximate predistorted data ($F_{Io}$, $F_{Qo}$) on the basis of a portion of 2M bits of the field of 2N bits (M<N), which data are thereafter revised with the air of the remaining portion of the field of 2(N−M) bits in order to produce revised predistorted input data ($\hat{F}_I$, $\hat{F}_Q$).

The transmit filter performs a spectral shaping which is completed by a filtering at the receive end so that the total transmit-receive filtering is a Nyquist filter thus permitting to guarantee zero intersymbol interference at the decision instants. For diminishing the size of the clouds of points it is necessary to make a correction with more than one sample per symbol period T.

Thus, determining in a cascaded manner approximate predistorted data and then the revised data advantageously requires only a reduced amount of material compared to determining the data with the aid of whole fields of 2N bits. This is particularly significant when the predistortion circuit utilizes a memory. When operating according to the invention, the size of the memory is diminished considerably. In this case the predistortion circuit comprises for each channel a separator for the M-bit field and the (N−M)-bit field, a memory addressed by the 2M-bit field which produces the approximate predistorted data ($F_{Io}$, $F_{Qo}$), and an interpolation circuit which derives therefrom the predistorted data ($\hat{F}_I$, $\hat{F}_Q$).

In order to determine the revised predistorted data ($\hat{F}_I$, $\hat{F}_Q$), the interpolation circuit utilises the approximate predistorted data ($F_{Io}$, $F_{Qo}$) to which values are added that depend on the mechanism developed by the separation of the fields of 2M bits and the fields of 2(N−M) bits. A particularly simple manner to effect this separation consists of isolating for each channel the M most significant bits from the (N−M) least significant bits. In this case the field of M bits represents a value x and the field of (N−M) bits represents a value Δx (y and Δy respectively, for the other channel). The interpolation circuit may effect a linear approximation around the point ($F_{Io}$, $F_{Qo}$). More particularly, when the approximate predistorted data addressed by the address values x and y are termed $F_{Io}$, $F_{Qo}$, the interpolation circuit may determine the revised predistorted data $\hat{F}_I$, $\hat{F}_Q$ according to:

$$\hat{F}_I = F_{Io} + (\partial F_I / \partial x) \cdot \Delta x + (\partial F_I / \partial y) \cdot \Delta y$$

$$\hat{F}_Q = F_{Qo} + (\partial F_Q / \partial x) \cdot \Delta x + (\partial F_Q / \partial y) \cdot \Delta y$$

where $\partial x$ and $\partial y$ are predetermined increments imposed on the values x and y which respectively correspond to the fields of 2M bits of the channels I and Q. These equations are determined by implementation of Cartesian coordinates. Similar equations may be determined by implementation of polar coordinates.

When the data $F_{Io}$, $F_{Qo}$ are stored in the memory it is sufficient to successively read from this memory address-couples (x+x,y) and (x,y+y). Thus, the partial derivations $\partial F_I/\partial x$, $\partial F_I/\partial y$, $\partial F_Q/\partial x$, $\partial F_Q/\partial y$ are determined by computing the differences.

But, in order to accelerate the process, it is advantageously possible to duplicate the loading of the memory in two further memories. One is addressed by the address-couple (x+ x,y) and the other by the address-couple (x,y+∂y). The values ∂x and ∂y advantageously correspond to a difference of 1 least significant bit of the corresponding address bit field.

The invention will be further described for a system comprising a fixed predistortion circuit. In effect, there are situations in which the distortion mechanisms are relatively stable or for which a perfect correction is not searched. But, generally, the distortion mechanisms are susceptible to evolution and it is thus necessary to correct them continuously. In this case the predistortion circuit is adaptive and, therefore, comprises an adaptation circuit which continuously adapts the predistortion circuit in response to a comparison of input data and transmitted data by means of a demodulation of the transmitted data stream. The difference found is used to correct the predistorted values ($F_{Io}$, $F_{Qo}$) which are stored in the memory and are updated regularly.

The transmit filter placed at the input of the system and which delivers various samples per symbol period may be constituted by a digital filter. It may also be constituted by an analog filter followed by an analog-to-digital converter which produces samples at the same rates.

BRIEF DESCRIPTION OF THE DRAWING

The invention will better understood with the aid of the following Figures given by way of non-limiting examples and representing.

DETAILED DESCRIPTION OF THE PREFERRED EMBODIMENTS

FIG. 1 is a representation of a prior-art constellation of the 64-QAM type. The inputs I (in-phase) and Q (quadrature) of the modulator are independent and the symbols on each channel take their values in an alphabet ($\pm d$, $\pm 3d$, $\pm 5d$, $\pm 7d$).

Figure 2A:
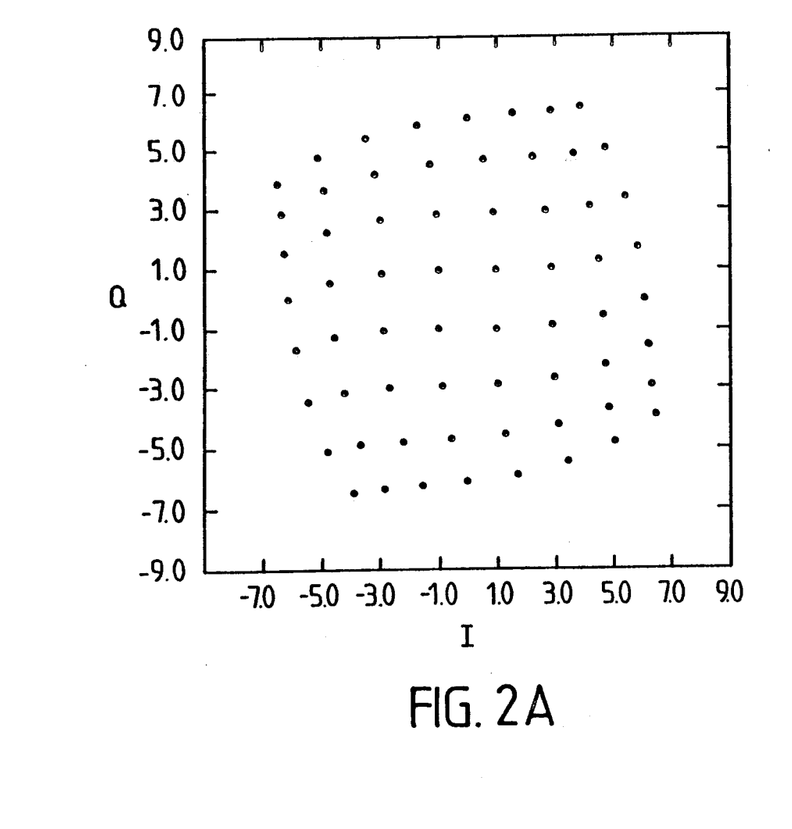
FIG. 2: a 64-QAM constellation distorted by the power amplifier in a system without a filter or in the case where all the Nyquist filtering is effected after the amplifier stage.
Figure 2B:
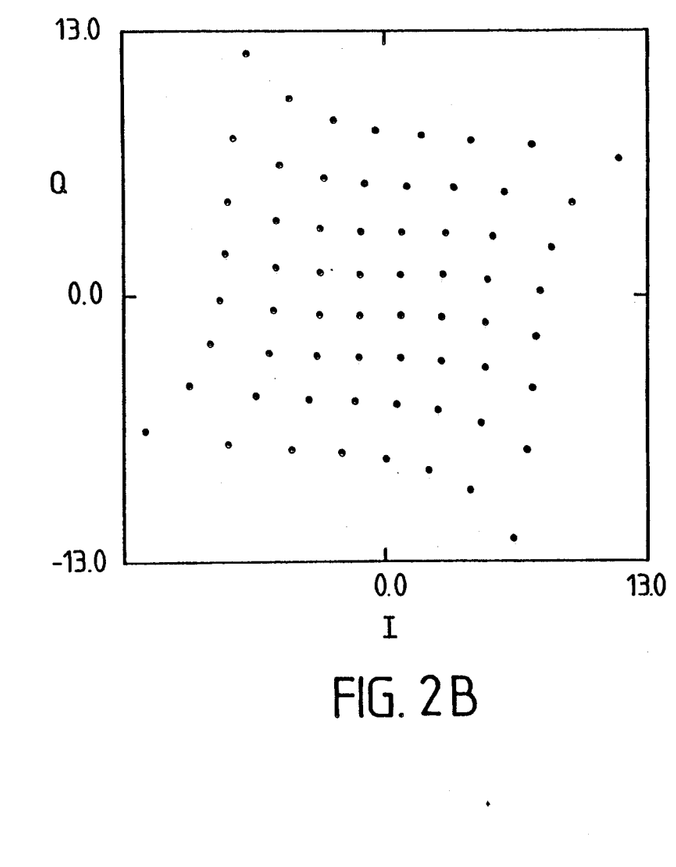
FIG. 2B: an optimized predistorted constellation for the compensation of the distortion illustrated in FIG. 2A according to the prior art.

In order to be transmitted, the signal from the modulator is fed to a power amplifier which is generally used at reduced power, that is to say, in a linear part of its characteristic. At high power this amplifier in non-linear and distorts the signal in an unacceptable manner. If one observes a constellation of the 64-QAM type at the output of such an amplifier operating near to saturation, a distorted constellation as the one represented in FIG. 2A will be observed. According to the prior art it will then be sufficient to predistort the constellation according to the diagram of FIG. 2B in opposite sense so that the original non-deformed constellation will be obtained at the output of the amplifier. Such a simple situation is not in conformity with reality where there is always a filter before the power amplifier notably to limit the bandwidth of the signal. If there is no filter, the signal at the input of the modulator varies in steps once per symbol period T. Thus, a predistortion circuit influencing the signal at the rate 1/T makes a perfect compensation possible. In contradistinction thereto, if the signal is filtered it no longer varies in steps but in a continuous fashion. For a perfect compensation of the non-linear effect it is no longer sufficient to observe the signal once per symbol period T and compensate for the distortion at these moments.

Figure 3A:
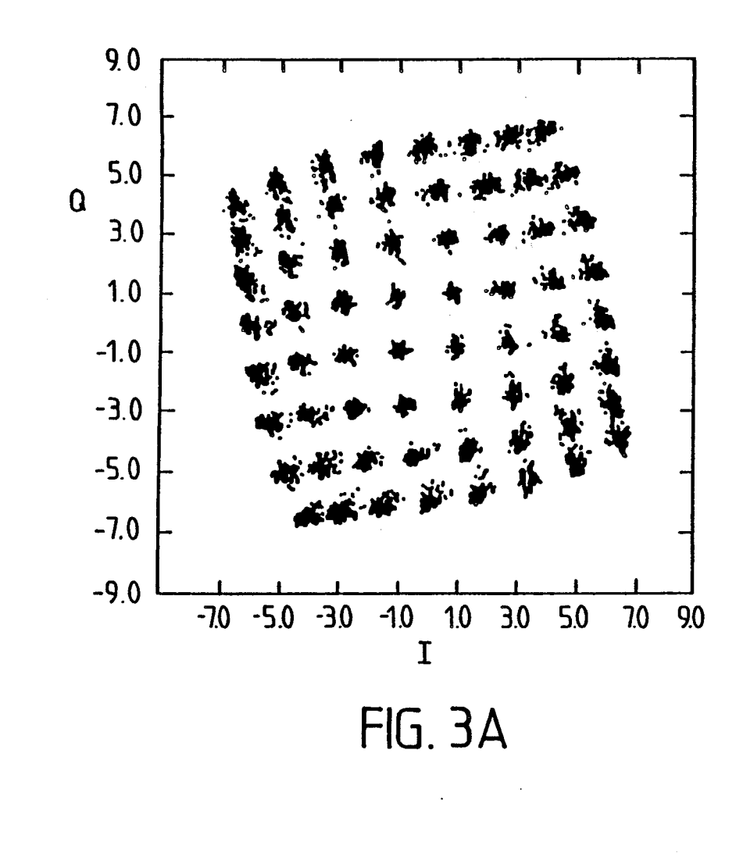
FIG. 3A: the constellation distorted by the amplifier as it appears when the total filtering is equally divided between transmit and receive ends and the part of the transmit end is placed before the amplifier.
Figure 3B:
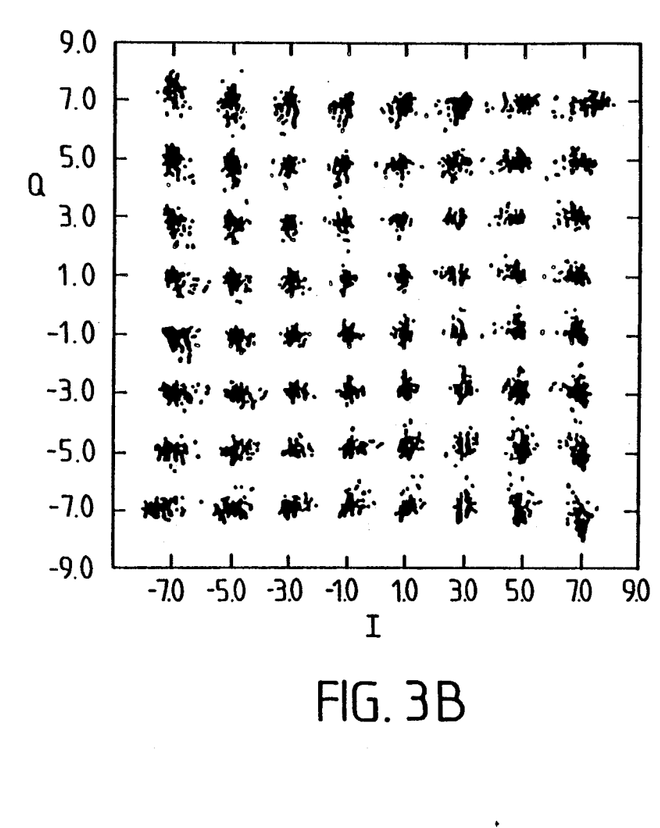
FIG. 3B: the same situation as the one of FIG. 3A, but incorporating the prior art predistortion circuit.

In the presence of a filtered signal the constellation at the output of the amplifier is represented in FIG. 3A. It develops into the one represented in FIG. 3B with the prior-art predistortion circuit. Thus, each point of the constellation becomes a cloud of points, which is unacceptable. In order to work with a filtered signal, one thus has to make corrections at more than one point per symbol period. Therefore, a spectral shaping of the transmission signal is effected by means of a digital filter producing at its output the filtered data at the rate k/T ($k \geq 2$). If this signal shaping is realized by an analog filter, the signal leaving the filter will be sampled at the rate k/T. In this manner, every T/k one disposes of samples of the filtered signal which one can predistort.

Figure 4:
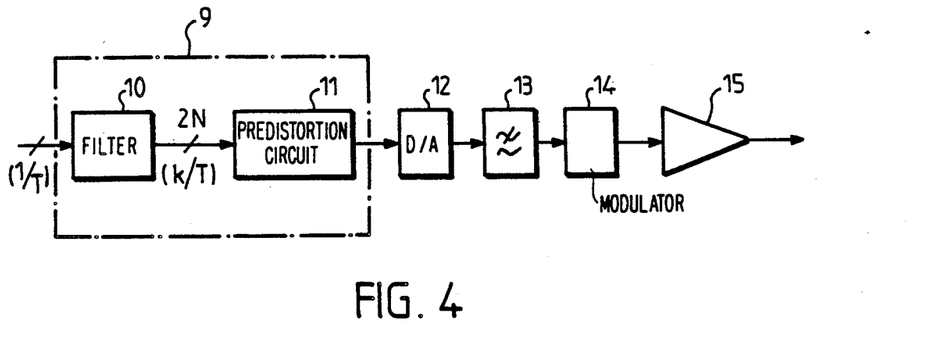
FIG. 4: a diagram of a digital transmission system according to the invention.

FIG. 4 represents a digital transmission system comprising a predistortion arrangement 9 with a transmit filter 10 producing N-bit encoded samples at the rate k/T (k is an integer at least equal to 2), and a predistortion circuit 11 followed by a digital-to-analog converter 12, an analog filter 13, a modulator 14 and an amplifier 15. It is this amplifier that distorts the data it is to transfer to the transmitting aerial.

Figure 5:
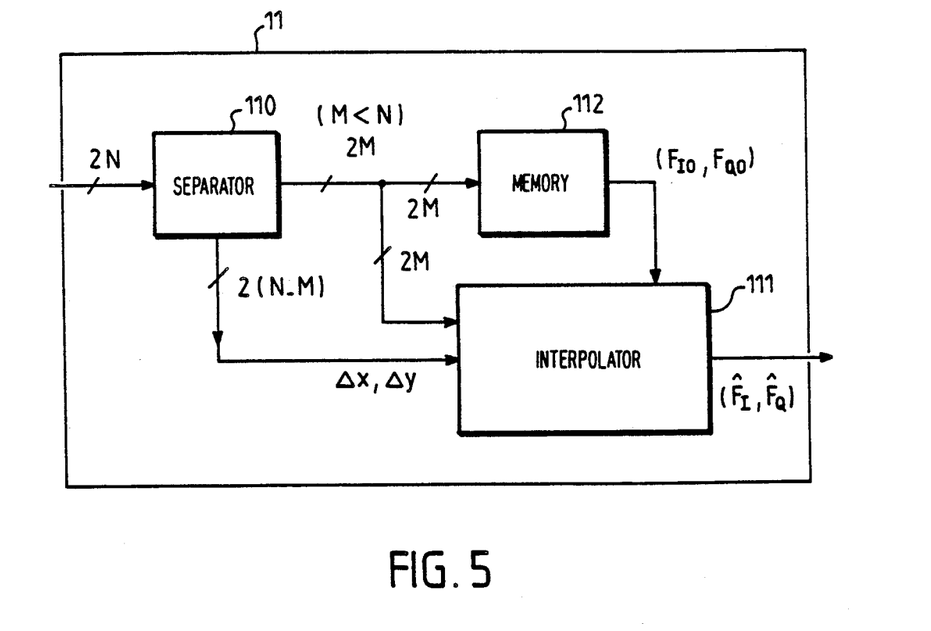
FIG. 5: a diagram of a predistortion circuit according to the invention.
Figure 6A:
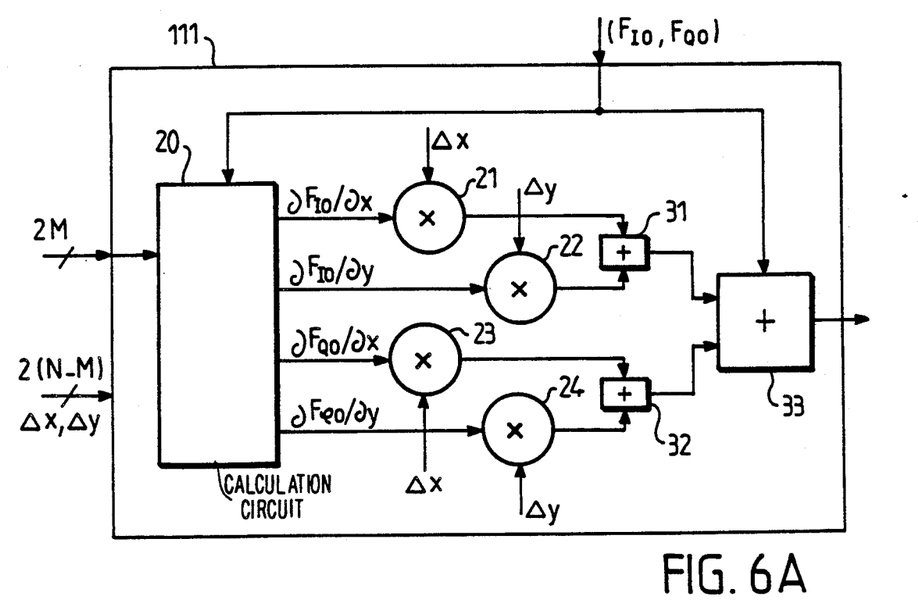
FIGS. 6A, 6B: embodiments of the predistortion circuit.
Figure 6B:
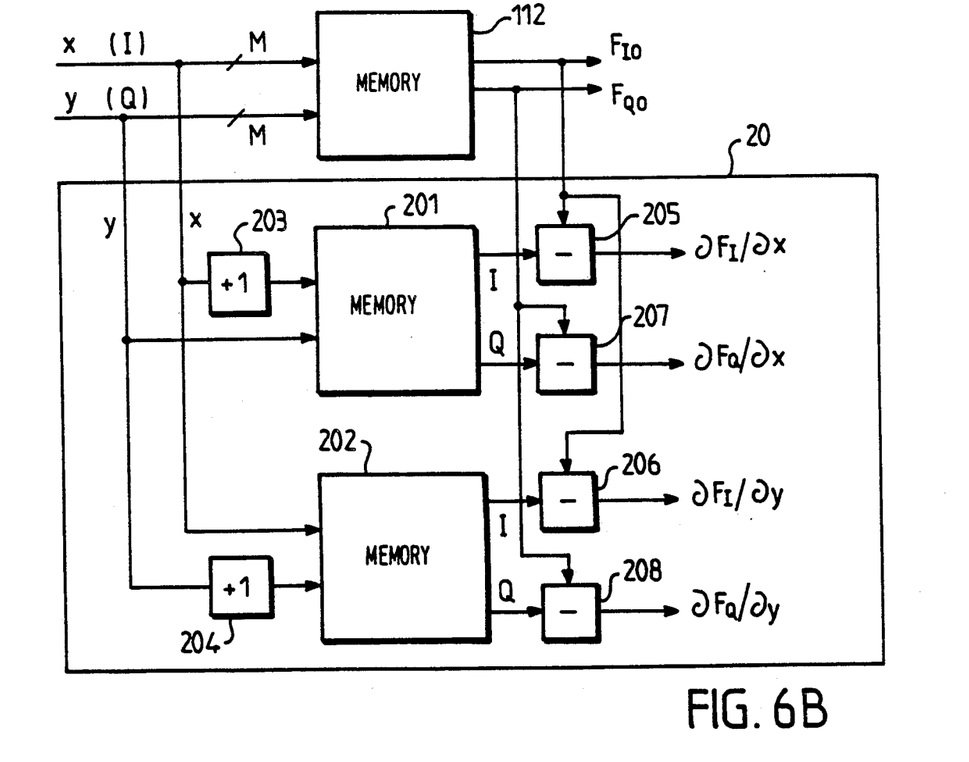

FIG. 5 represents an example of a diagram of the predistortion circuit 11. It comprises a separator 110 which receives the complex 2N-bit encoded data (channels I and Q) and which separates for each channel a field of M most significant bits from a rest field of (N−M) least significant bits (M<N). The fields of 2M bits address a memory 112 which stores approximate predistorted values ($F_{Io}$, $F_{Qo}$). The fields of 2(N−M) bits enter an interpolation circuit 111. The two fields of (N−M) bits represent a value $\Delta x$ and $\Delta y$ for each channel. The two fields of M bits represent a value x and y for each channel. On the basis of approximate data $F_{Io}$, $F_{Qo}$ and their address fields, the interpolation circuit 111 computes and revised data ($F_I$, $F_Q$) with the aid of the values $\Delta x$, $\Delta y$. An embodiment, represented in the FIGS. 6A and 6B performs the calculations in Cartesian coordinates according to:

$$\hat{F}_I = F_{Io} + (\partial F_I/\partial x)\cdot \Delta x + (\partial F_I/\partial y)\cdot \Delta y$$

$$\hat{F}_Q = F_{Qo} + (\partial F_Q/\partial x)\cdot \Delta x + (\partial F_Q/\partial y)\cdot \Delta y$$

For this reason, a circuit 20 for calculating partial derived values calculates for each approximate value $F_{Io}$, $F_{Qo}$ the partial derivations by applying increments $\partial x$, $\partial y$ to the values associated to the address fields. These partial derivatives and the values $\Delta x$, $\Delta y$ are used to determine $\hat{F}_I$, $\hat{F}_Q$ according to the preceding equations with the aid of the multipliers 21, 22, 23, 24 and adders 31, 32, 33.

Circuit 20 may comprises memory 112. In that case this memory is read out several times in succession and operates according to the mechanism to be described hereinafter. But, preferably, three memories are used for performing a parallel operation according to the diagram of FIG. 6B. Two memories 201, 202 store the same data as memory 112. Memory 201 is addressed by field Q or M bits and by field I of M bits (value x) which is incremented by 1 bit in the adder 203. This value of 1 bit ($\partial x$ increment) makes it possible to calculate the partial derivations $\partial F_I/\partial x$, $\partial F_Q/\partial x$ by a simple difference formation in the subtractors 205 and 207 for the channels I and Q.

Likewise, memory 202 is addressed by field I of M bits and by field Q or M bits (value y) which is incremented by 1 bit in the adder 204. This value of 1 bit ($\partial y$ increment) makes it possible to calculate the partial derivations $\partial F_I/\partial y$ and $\partial F_Q/\partial y$ by a simple difference formation in the subtractors 206 and 208 for the channels I and Q.

Thus, when addressing memory 112 by a field of M bits instead of a field of N bits its size is reduced considerably and will be $2^{2M}$ words. In the applications using 64-QAM and 256-QAM modulation methods, N is generally of the order of 10 bits. When passing from N=10 bits to M=4 or 5 bits, the size of the memory is reduced to approximately 1 Kword instead of 1 Mword, which is a considerable reduction whereas a good compensation of the amplifier distortions is preserved.

The transmit filter 10 (FIG. 4) is to deliver the complex samples encoded in N bits at the rate k/T, where k is at least equal to 2. This transmit filter may be a digital filter. It may also be constituted by an analog filter followed by an analog-to-digital conversion.

Figure 7:
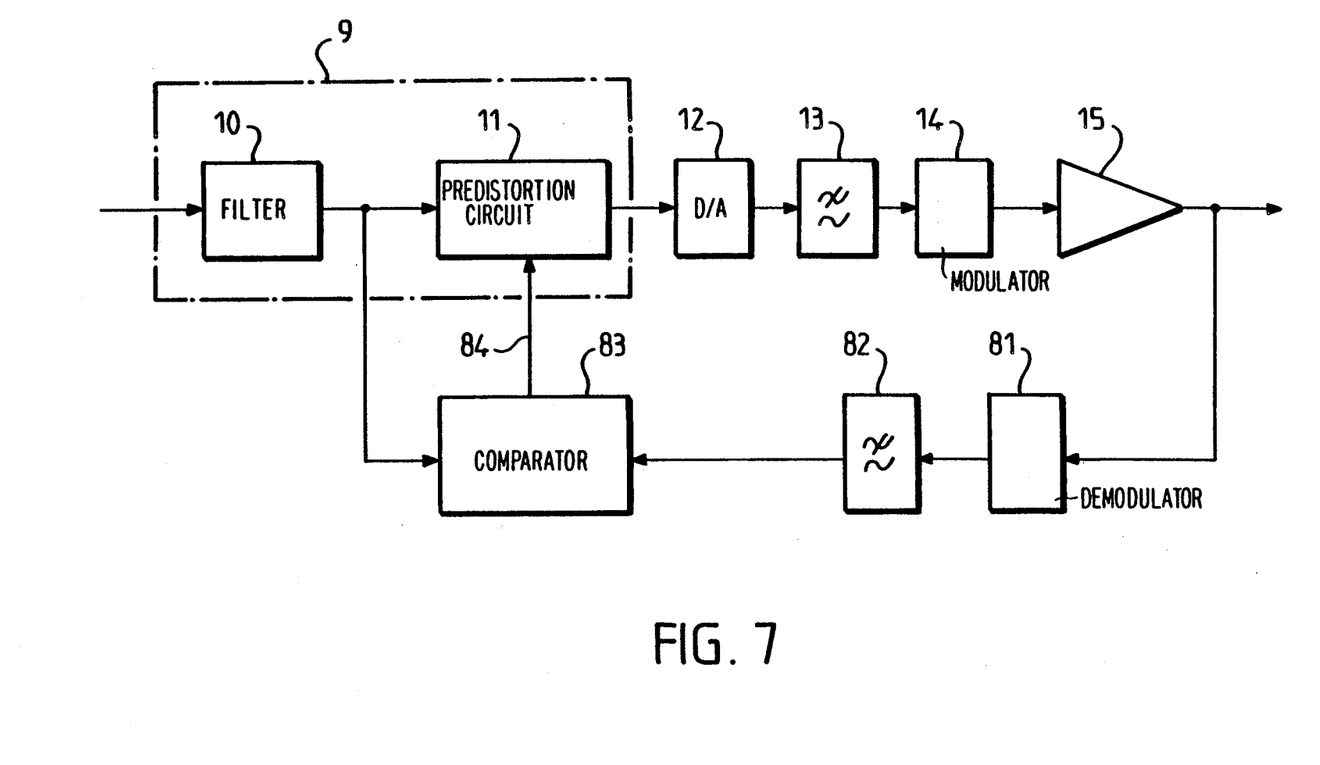
FIG. 7: a diagram of a digital transmission system comprising an adaptive predistortion circuit according to the invention.

The diagram of FIG. 4 represents a transmission system with which it is possible to predistort the data and correct the distortions introduced by the amplifier in the case of a fixed structure. But, alternatively, it is possible to realise an adaptive structure. This is represented in the diagram of FIG. 7. The same elements as those of FIG. 4 are represented having the same reference numerals. In this case the output signal of the amplifier 15 is tapped in order to be fed to a demodulator 81 followed by a low-pass filter 82 whose output signal is fed to an adaptation circuit 83. This circuit samples the output signal of the filter 82 and compares these data to the input data. The difference causes an error signal to develop which permits (connecting line 84) to update the predistortion circuit 11, for example, by storing new values $F_{Io}$, $F_{Qo}$ in the memory.

We claim:

1. A predistortion arrangement for a digital transmission system which transmits complex input data at a rate defined by a clock having a period T, comprising a power amplifier which introduces nonlinear distortion into data signals being transmitted, a modulator driving the power amplifier, and a predistortion circuit for predistorting input data signals in a sense opposite to distortion introduced in the power amplifier, and providing the predistorted signals to the modulator, characterized in that the predistortion circuit comprises a transmit filter means, responsive to receiving input data, for providing filtered, oversampled data encoded with 2N bits as respective in-phase and quadrature channels, at a rate k/T, where k is an integer greater than 1, means for receiving said filtered, oversampled data, and separating each channel into a field of M bits and a field of N−M bits, a memory addressed by the field of M bits for determining approximate predistorted data ($F_{Io}$, $F_{Qo}$) based on a portion 2M of bits of a field comprising 2N bits, where M<N, and an interpolation circuit, using the remaining 2(N−M) bits portion of said field, for producing revised predistorted input data ($F_I$, $F_Q$).

2. Arrangement as claimed in claim 1, characterized in that the transmit filter is either a digital filter or an analog filter having an output connected to an analog-to-digital converter.

3. Arrangement as claimed in claim 1, characterized in that the interpolation circuit performs a linear approximation around the points ($F_{Io}$, $F_{Qo}$).

4. Arrangement as claimed in claim 3, characterized in that the separator isolates the fields of M most significant bits while the interpolation circuit determines the data $\hat{F}_I$, $\hat{F}_Q$ according to:

$$\hat{F}_I = F_{Io} + (\partial F_I/\partial x)\cdot\Delta x + (\partial F_I/\partial y)\cdot\Delta y$$

$$\hat{F}_Q = F_{Qo} + (\partial F_Q/\partial x)\cdot\Delta x + (\partial F_Q/\partial y)\cdot\Delta y$$

where $\Delta x$ and $\Delta y$ represent the values corresponding to the fields of (N−M) bits on the channels I (in-phase) and Q (quadrature) respectively, and $\partial x$ and $\partial y$ are predetermined increments imposed on the values x and y corresponding to the fields of M bits of the channels I and Q respectively, which makes it possible to calculate partial derivations of the channels I and Q.

5. Arrangement as claimed in claim 4, characterized in that the values $\partial F_I/\partial x$, $\partial F_Q/\partial x$ and $\partial F_I/\partial y$, $\partial F_Q/\partial y$ are obtained by successively addressing the memory by the values $[(x+\partial x);y]$ and $[x;(y+\partial y)]$.

6. Arrangement as claimed in claim 5, characterized in that the loading of the memory is duplicated in two further memories for making a parallel calculation possible of the partial derivations.

7. Arrangement as claimed in claim 4, characterized in that the values $\partial x$ and $\partial y$ correspond to a difference of 1 least significant bit of the corresponding address bit field.

8. Arrangement as claimed in claim 4, characterized in that the transmit filter is either a digital filter or an analog filter having an output connected to an analog-to-digital converter.

9. Arrangement as claimed in claim 3, characterized in that the transmit filter is either a digital filter or an analog filter having an output connected to an analog-to-digital converter.

10. Arrangement as claimed in claim 5, characterized in that the values $\delta x$ and $\delta y$ correspond to a difference of 1 least significant bit of the corresponding address bit field.

11. Arrangement as claimed in claim 6, characterized in that the values $\delta x$ and $\delta y$ correspond to a difference of 1 least significant bit of the corresponding address bit field.

12. Arrangement as claimed in claim 11, characterized in that the transmit filter is either a digital filter or an analog filter having an output connected to an analog-to-digital converter.

13. Arrangement as claimed in claim 12, characterized in that the predistortion circuit is adaptive and therefore comprises an adaptation circuit which continuously adapts the predistortion circuit in response to a comparison of the input data and the transmitted data, by means of a demodulation of the transmitted data stream.

14. A predistortion arrangement for a digital transmission system which transmits complex input data at a rate defined by a clock having a period T, comprising a power amplifier which introduces nonlinear distortion into data signals being transmitted, a modulator driving the power amplifier, and a predistortion circuit for predistorting input data signals in a sense opposite to distortion introduced in the power amplifier, and providing the predistorted signals to the modulator, characterized in that the predistortion circuit comprises a transmit filter means, responsive to receiving input data, for providing filtered, oversampled data encoded with 2N bits, at a rate k/T, where k is an integer greater than 1, means for receiving said filtered, oversampled data, and determining approximate predistorted data ($F_{Io}$, $F_{Qo}$) based on a portion 2M of bits of a field comprising 2N bits, where M<N, and revising means, using the remaining 2(N−M) bits portion of said field, for producing revised predistorted input data ($F_I$, $F_Q$).

15. Arrangement as claimed in claim 14, characterized in that the transmit filter is either a digital filter or an analog filter having an output connected to an analog-to-digital converter.

16. Arrangement as claimed in claim 14, characterized in that the predistortion circuit is adaptive and therefore comprises an adaptation circuit which continuously adapts the predistortion circuit in response to a comparison of the input data and the transmitted data, by means of a demodulation of the transmitted data stream.

* * * * *